United States Patent
Bencher et al.

(10) Patent No.: US 9,484,274 B2
(45) Date of Patent: Nov. 1, 2016

(54) METHODS FOR REDUCING SEMICONDUCTOR SUBSTRATE STRAIN VARIATION

(71) Applicant: Applied Materials, Inc., Santa Clara, CA (US)

(72) Inventors: Christopher Dennis Bencher, Cupertino, CA (US); Ehud Tzuri, Mefalsim (IL); Ellie Y. Yieh, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 14/730,198

(22) Filed: Jun. 3, 2015

(65) Prior Publication Data
US 2015/0371908 A1 Dec. 24, 2015

Related U.S. Application Data

(60) Provisional application No. 62/014,767, filed on Jun. 20, 2014.

(51) Int. Cl.
*H01L 21/02* (2006.01)
*H01L 21/66* (2006.01)
*H01L 21/268* (2006.01)

(52) U.S. Cl.
CPC .......... *H01L 22/20* (2013.01); *H01L 21/2686* (2013.01); *H01L 22/12* (2013.01)

(58) Field of Classification Search
CPC .................. H01L 21/02002; H01L 21/02098
USPC ............................................................ 438/3
See application file for complete search history.

(56) References Cited

U.S. PATENT DOCUMENTS

| | | | |
|---|---|---|---|
| 2006/0055928 A1* | 3/2006 | Chang | H01L 22/34 356/400 |
| 2010/0277850 A1* | 11/2010 | Chang | H01L 21/6831 361/234 |
| 2012/0227014 A1 | 9/2012 | Pforr | |
| 2013/0044331 A1 | 2/2013 | Manassen et al. | |
| 2014/0017604 A1* | 1/2014 | Lee | G03F 7/70633 430/30 |

(Continued)

FOREIGN PATENT DOCUMENTS

KR 2013-0120975 A 11/2013

OTHER PUBLICATIONS

PCT Search Report for PCT/US2015/031973 dated Aug. 31, 2015 (11 pgs.).

*Primary Examiner* — Jami M Valentine
(74) *Attorney, Agent, or Firm* — Patterson & Sheridan, LLP

(57) ABSTRACT

Embodiments of the disclosure provide methods and system for correcting lithographic film stress/strain variations on a semiconductor substrate using laser energy treatment process. In one embodiment, a method for correcting film stress/strain variations on a substrate includes performing a measurement process in a metrology tool on a substrate to obtain a substrate distortion or an overlay error map, determining dose of laser energy in a computing system to correct film stress/strain variations or substrate distortion based on the overlay error map, and providing a laser energy treatment recipe to a laser energy apparatus based on the dose of laser energy determined to correct substrate distortion or film stress/strain variations.

20 Claims, 5 Drawing Sheets

(56) References Cited

U.S. PATENT DOCUMENTS

2014/0036243 A1\* 2/2014 Beyer .................. G03F 1/72
                                                    355/52
2015/0376776 A1\* 12/2015 Datta .................. C23C 14/0617
                                                    427/248.1
2016/0005662 A1\* 1/2016 Yieh ..................... H01L 22/20
                                                    438/14

\* cited by examiner

METHODS FOR REDUCING SEMICONDUCTOR SUBSTRATE STRAIN VARIATION

CROSS-REFERENCE TO RELATED APPLICATIONS

This application claims benefit of U.S. Provisional Application Ser. No. 62/014,767 filed Jun. 20, 2014, which is incorporated by reference in its entirety.

BACKGROUND OF THE INVENTION

Field of the Invention

Embodiments of the disclosure generally relate to methods and a system for substrate strain variation reduction, more specifically, methods and a system for substrate strain variation reduction for lithography process on a semiconductor substrate using laser energy treatment process.

Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Typically, devices on semiconductor substrates are manufactured by a sequence of lithographic processing steps in which the devices are formed from a plurality of overlying layers, each having an individual pattern. Generally, a set of 15 to 100 masks is used to construct a chip and can be used repeatedly.

Between one layer and the next layer that overlays the previous one, the individual patterns of the one layer and the next layer must be aligned. A measurement of alignment marks may be obtained by a metrology tool which is then used by a lithography tool to align the subsequent layers during exposure and again after a lithography process to recheck a performance of the alignment. However, film stress/strain variations (or pattern registration errors) between layers are inevitable, and error budgets are calculated by IC designers for which the manufacturing must meet. Film stress/strain variations of the device structure may originate from different error sources, such as film stress/strain variations from previous exposure tool/metrology tool, current exposure tool/metrology tool, a matching error between the film stress/strain variations of the previous exposure tool/metrology tool and of the current exposure tool/metrology tool, or substrate film layer deformation caused by film stress and the like.

FIG. 1 depicts an overlay error map 100 of a semiconductor substrate measured after a sequence of lithographic exposure processes. In the embodiment of FIG. 1, some patterns shown in an enlarged portion 102 of the substrate are shifted or displaced from their designed location. As discussed above, displacement or misalignment of the patterns creates film stress/strain variations that may be detrimental to device performance.

FIG. 2 depict another schematic view of device dies 202, 204, 206 formed on a substrate 200. The dies 202, 2041, 206 are typically designed to have a substantially square-like outline if substantially no film stress/strain variations or pattern displacement has occurred during fabrication. However, when film stress/strain variations, film stress/strain variations or pattern displacement undesirably occurs, the size, dimension or structures of dies 202, 204, 206 formed on the substrate 200 may be irregularly deformed or distorted, thus increasing likelihood of misalignment between the film layers stacked thereon that may adversely increase the probability of misalignment in the subsequent lithographic exposure process.

With the shrink of critical dimensions (CD), film stress/strain variations in the critical layers of the device structure must be minimal or eliminated in order to reliably produce devices with minimal feature sizes, such as a width of a control gate in a device. To eliminate the likelihood of film stress/strain variations, a single exposure lithographic tool is used in many cases to pattern successive layers in an attempt to eliminate tool to tool imprecision errors. However, this approach often creates logistic problems and adversely increases manufacture cycle time. Furthermore, overlay specifications have become more challenging that the non-lithographic contributions (i.e., film stress) to film stress/strain variations through stress induced substrate distortion, may alone exceed the error budget.

Therefore, there exists a need for improved methods and system to correct film stress/strain variations prior to performing lithographic exposure processes so as to improve device performance and maintain predicable product reliability and yield.

SUMMARY

Embodiments of the disclosure provide methods and system for correcting lithographic film stress/strain variations on a semiconductor substrate using laser energy treatment process. In one embodiment, a method for correcting film stress/strain variations on a substrate includes performing a measurement process in a metrology tool on a substrate to obtain a substrate distortion or an overlay error map, determining dose of laser energy in a computing system to correct film stress/strain variations based on the overlay error map, and providing a laser energy treatment recipe to a laser energy apparatus based on the dose of laser energy determined to correct substrate distortion or film stress/strain variations.

In another embodiment, a method for correcting film stress/strain variations on a substrate includes measuring a film stress hysteresis behavior as a function of laser wavelength or dose for the film layers deposited on a substrate, creating a correlation to the film stress hysteresis behavior with a database library to determine a laser energy treatment recipe to be performed in a laser energy apparatus, and performing a laser energy treatment process on selected discrete locations of the film layer using the determined laser energy treatment recipe.

In yet another embodiment, a method for correcting film stress/strain variations on a substrate includes measuring a film stress, substrate curvature or in-plane distortion or pattern shift of a film layer disposed on a substrate, determining an overlay error map or substrate distortion based on the measured film stress on the film layer, determining a laser energy treatment recipe based on the measured film stress on the substrate, and laser treating the film layer using the determined laser energy treatment recipe to locally change the film stress of the film layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the disclosure describe an film stress/strain variation correction process that may be utilized to correct or minimize film stress/strain variations after a sequence of lithographic exposure processes. In one embodiment, the film stress/strain variations may be corrected by utilizing a laser energy treatment process to dose laser energy to a film layer to alter film stress/strain in the film layer disposed on the semiconductor substrate. By establishing an algorithm that may compute the amount of laser dose required to treatment the film layers on the semiconductor substrate, the film stress/strain variations may be corrected and eliminated so as to increase alignment precision for the next lithographic exposure process.

Figure 3:
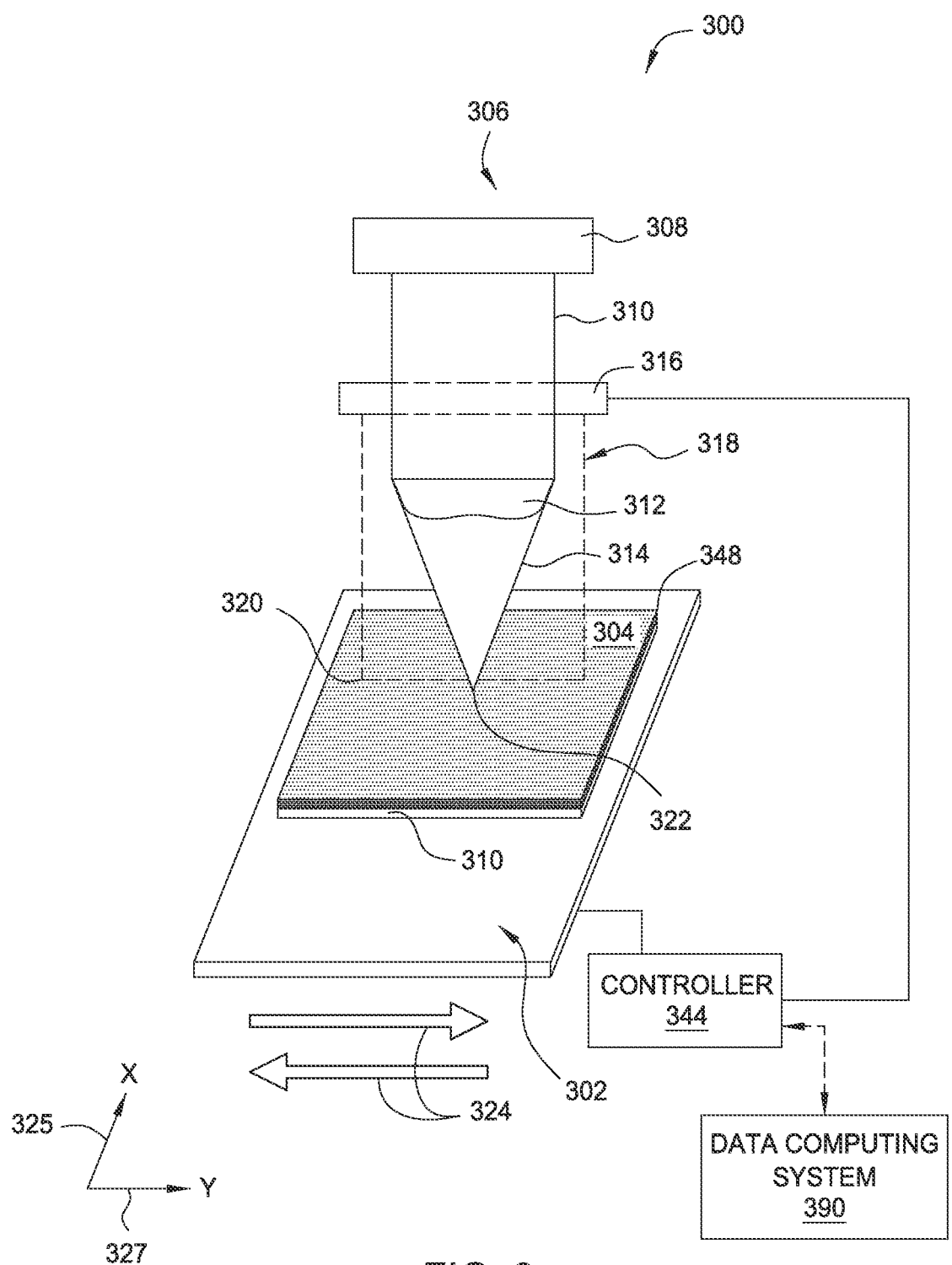
FIG. 3 depicts a laser energy apparatus that may be utilized to treatment film stress/strain variations on a semiconductor substrate.

FIG. 3 depicts a laser energy apparatus 300 that may be used to provide laser energy to a film layer that may alter a stress/strain of the film layer so as to correct or treatment film stress/strain variations present on semiconductor devices. In one embodiment, the laser energy apparatus 300 comprises a laser module 306, a stage 302 configured to support a substrate, such as the substrate 310, a translation mechanism 324 configured to control the movement of the stage 302. The laser module 306 comprises a laser radiation source 308 and an optical focusing module 310 disposed between the laser radiation source 308 and the stage 302.

In one embodiment, the laser radiation source 308 may be a light source made from Nd:YAG, Nd:YVO$_4$, crystalline disk, diode pumped fiber and other light source that can provide and emit a pulsed or continuous wave of radiation at a wavelength between about 180 nm and about 2000 nm, such as about 260 nm or 405 nm. In another embodiment, the laser radiation source 308 may include multiple laser diodes, each of which produce uniform and spatially coherent light at the same wavelength. In yet another embodiment, the power of the cumulative laser diode(s) is in the range of about 10 Watts to 200 Watts.

The optical focusing module 310 transforms the radiation emitted by the laser radiation source 308 using at least one lens 312 into a line, spot, or other suitable beam configuration, of radiation 314 directed at a film layer 304 disposed on the semiconductor substrate 310. The radiation 314 is selectively applied to a surface of the film layer 304 to provide laser energy doze to discrete predetermined regions of the film layer 304. In one embodiment, the radiation 314 may be selectively applied to the surface of the material layer 304 as many times as needed until a desired chance in the stress present in the film layer 304 is obtained. In another architecture, the laser may be reflected off a digital micromirror device, such as a Texas Instruments DLP chip, which then projects a laser pattern onto the substrate (enlarged to treat the whole substrate or in a small field which is scanned across the substrate) to build up the treatment dosage map.

Lens 312 of the focusing optical module 310 may be any suitable lens, or series of lenses, capable of focusing radiation into a line or spot. In one embodiment, lens 312 is a cylindrical lens. Alternatively, lens 312 may be one or more concave lenses, convex lenses, plane mirrors, concave mirrors, convex mirrors, refractive lenses, diffractive lenses, Fresnel lenses, gradient index lenses, or the like.

A detector 316 is disposed in the laser energy apparatus 300 above the stage 302. In one embodiment, the detector 316 may be an optical detector may provide a light source with different wavelengths to inspect and detect film properties of the film layer 304 and/or the semiconductor substrate 310 positioned on the stage 302. In one embodiment, the detector 316 and light source may form part of an optical microscope (OM) that may be used to view individual device die pattern or features formed in the film layer 304, the substrate 310 and there between. In another embodiment, the detector 316 may be a metrology tool or a sensor capable of detecting local thickness, stress, refractive index (n&k), surface roughness or resistivity on the material layer 304 and/or the substrate 310 prior to performing a laser energy process. In yet another embodiment, the detector 316 may include a camera that may capture images of the film layer 304 and/or the substrate 310 so as to analyze the film layer 304 and/or the substrate 310 based on the image color contrast, image brightness contrast, image comparison and the like. In another embodiment, the detector 316 may be any suitable detector that may detect different film properties or characteristics, such as stress, of the substrate or the film layers disposed on the substrate.

The detector 316 may linearly scan the substrate surface using a line of optical radiation 318 provided therefrom across a linear region 320 of the substrate 310. The detector 316 may also help to identify the coordinate, alignment, or orientation of the substrate 310. The detector 316 may scan the substrate 310 as the substrate 310 advances in an X-direction 325. Similarly, the detector 316 may scan the substrate 310 as the substrate 310 moves in a Y-direction 327 as the translation mechanism 324 moves the stage 302. The detector 316 may be coupled to a controller 344, so as to control movement and data transfer from the detector 316 or other detectors or computing system to the laser energy apparatus 300.

The controller 344 may be a high speed computer configured to control the detector 316 and/or the laser module 306 to perform an optical detection process and/or a laser energy treatment process. In one embodiment, the optical detection process is performed by the detector 316 prior to the laser energy treatment process, so that the process parameters set in a laser energy treatment recipe for performing a laser energy process may be based on the measurement data received from the optical detection process. In one embodiment, the controller 344 may be further coupled to a data computing system 390 to obtain data or computed algorithm from the data computing system 390 so as to assist determining a proper recipe to perform the laser energy treatment process on the film layer 304 of the substrate 310.

In one embodiment, the translation mechanism 324 may be configured to translate the stage 302 and the radiation 314 relative to one another. The translation mechanism 324 may be configured to move the stage 302 in different directions. In one embodiment, the translation mechanism 324 coupled to the stage 302 is adapted to move the stage 302 relative to the laser module 306 and/or the detector 316. In another embodiment, the translation mechanism 324 is coupled to the laser radiation source 308 and/or the focusing optical module 310 and/or the detector 316 to move the laser radiation source 308, the focusing optical module 310, and/or the detector 316 to cause the beam of energy to move relative to the substrate 310 that is disposed on the stationary stage 302. In yet another embodiment, the translation mechanism 324 moves the laser radiation source 308 and/or the focusing optical module 310, the detector 316, and the stage 302. Any suitable translation mechanism may be used, such as a conveyor system, rack and pinion system, or an x/y actuator, a robot, or other suitable mechanical or electromechanical mechanism to use for the translation mechanism 324. Alternatively, the stage 302 may be configured to be stationary, while a plurality of galvanometric heads (not shown) may be disposed around the substrate edge to direct radiation from the laser radiation source 208 to the substrate as needed.

The translation mechanism 324 may be coupled to the controller 344 to control the scan speed at which the stage 302, the line of radiation 314, and line of optical radiation 318 move relative to one another. The controller 344 may receive data from the detector 316 or from the data computing system 390 to generate an optimized laser energy recipe that is used to control the laser module 306 to perform an optimized laser dose patterning process. The stage 302 and the radiation 314 and/or the optical radiation 318 are moved relative to one another so that energy is delivered to discrete desired regions 322 of the material layer 304. In one embodiment, the translation mechanism 324 moves at a constant speed. In another embodiment, the translation of the stage 302 and movement of the line of radiation 314 and/or the line of optical radiation 318 follow different paths that are controlled by the controller 344.

Figure 4:
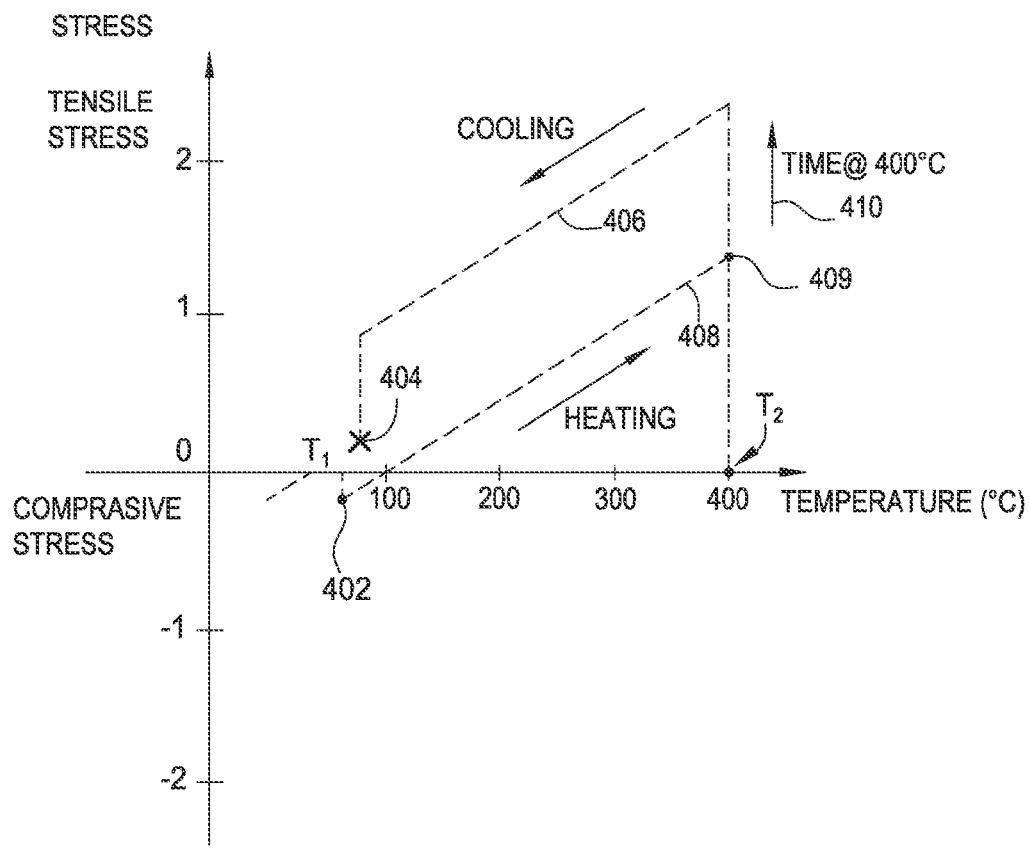
FIG. 4 depicts a stress hysteresis diagram of a film layer.

FIG. 4 depicts a diagram of stress hysteresis of a film layer in response to exposure to thermal process. In the embodiment depicted in FIG. 4, the film layer exposed to the thermal process is a device hardmask layer, such as an amorphous carbon film. It is noted that other types of the film layers, including organic materials, inorganic materials, metal materials, metal dielectric materials, or any other materials that may be utilized to form semiconductor devices may also be tested to record their stress hysteresis to establish database library. Alternatively, a thin capping layer may be disposed on the hardmask layer. The thin capping layer may be a dielectric layer.

In the stress hysteresis diagram depicted in FIG. 4, the film layer may have a first stress value 402 (e.g., an original stress value). It is believed that most device materials undergo residual stress changes when thermally cycled, which inevitably occurs during the subsequent processing steps at high temperatures. During processing, the film layer may undergo thermal energy treatment from a first temperature $T_1$ to a second temperature $T_2$ (e.g., a desired target processing temperature), as indicated by the trace line 408. While the thermal energy is absorbed by the film layer, the film stress undergo stress relaxation governed by the film material properties and also stress may change due to thermal expansion mismatch relative to the substrate, as shown in the dotted line 408, from the first stress value 402 (e.g., the original stress value) with a tensile film property to a second stress value 409. Upon reaching to the desired temperature $T_2$ during processing, the film stress may maintain at the steady value, e.g., the second stress value 409, as indicated in the dotted line 410, until the desired processing time or result is reached and completed. After the thermal energy treatment, the film layer is cooled, for example by resting on or near a cooling plate, or simply placed in a room temperature environment. The film layer disposed on the substrate may be cooled to a room temperature or to the original starting temperature $T_1$, as indicated by the dotted line 406. As the film layer is cooled, the film stress reduces to a second stress value 404, which is different than the original starting stress value 402.

It is noted that after a sequence of the thermal processing cycles during the multiple semiconductor device manufacturing processes, the film stress of the film layer changes as compared to the film stress of the original film layer. As the film layer may be densified, purified, or deformed after the thermal processing cycles, the film residual stress may undesirably result in substrate bow, warpage or substrate curvature. In such cases, misalignment between the features present on the film layer pattern formed by the lithographic exposure process may become significant, resulting in film stress/strain variations that may result in feature deformation or structure collapse. Additionally, most deposited materials have a native residual stress which induces substrate bow, warpage and grid-distortion simply as a function of their deposition. These stresses are often not uniform across the substrate surface and lead to non-uniform substrate bow, warpage and grid-distortion. Even in theoretical case where a film deposition has perfectly uniform stress across the wafer, an irregular pattern will be etched into it, which eventually results in a non-uniform substrate bow, warpage, and grid-distortion.

It is believed that by utilizing a laser energy treatment process, the residual film stress hysteresis behavior at certain localized areas in the film layer may be exploited to correct substrate warpage and correct the grid-distortion. This will enable improved overlay during the subsequent lithography exposure process. The laser energy may assist releasing local strains or non-uniform stress distribution at certain discrete areas of the film layer so that a more uniform film structure with a substantially uniform film quality may be obtained that improves lithographic alignment with minimum film stress/strain variations in a lithographic exposure process. As such, based on the film property performance after the thermal process cycles depicted in FIG. 4, a correlation between the actual film stress and a desired film stress need to improve lithographic alignment may be determined. The correction may be embodied in a stress map, in-plane distortion map or dosage map from which the controller may cause the translation mechanism and laser radiation source to deliver laser energy to discrete regions of the film identified by the detector to locally relieve the stress and correct the pattern in the underlying film layer so that subsequent lithography and patterning of the film layer may be precisely align with the openings formed in the layers underlying the film layer.

Figure 5:
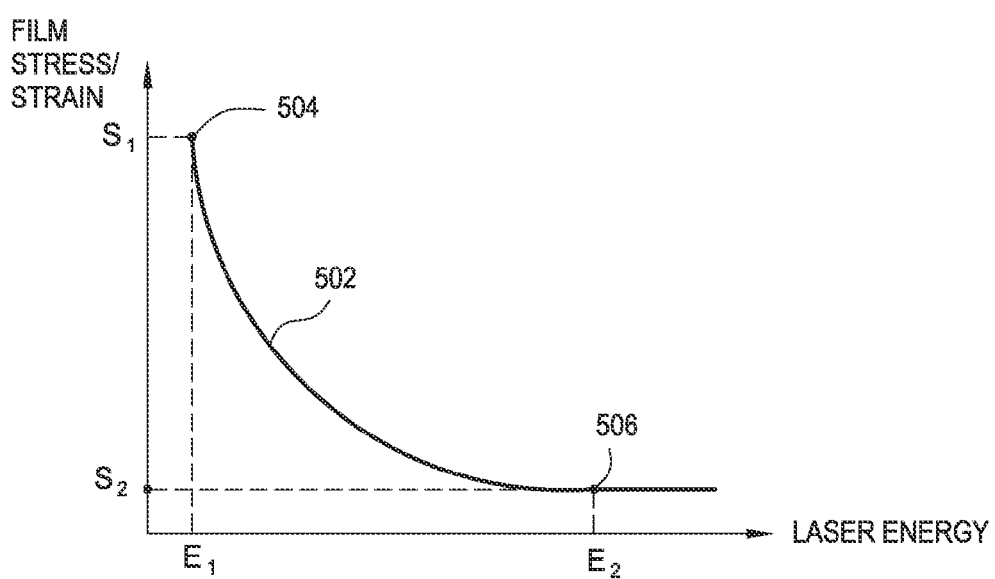
FIG. 5 depicts a correlation of a laser energy dose to a film stress in accordance one embodiment of the disclosure.

In the embodiment depicted in FIG. 5, when the film layer has a film stress 504 with relatively high stress value $S_1$, a lower laser energy $E_1$ may be utilized to treat the film layer. In contrast, when the film layer has a film stress 506 with relatively a low stress value $S_2$, a relatively higher laser energy $E_2$ may be utilized to treat the film layer. The correlation between the film stress value and the laser energy doze may be in an inversely proportional relationship, as shown in the trace line 502. It is noted that the subsequent heating cycles, film stress values and the corresponding laser dose level may have relationships, based on the nature of the film properties, process temperature employed, and laser radiation applied, such as different selection of laser frequency or laser light sources.

By obtaining the relationship/correlation of the film stress (or in-plane strain, pattern shift, or substrate curvature) to the laser energy dose required to treatment the film layer, a database library may be established. As such, the residual film stress at discrete localized areas of the film layer may be corrected or released based on the computation/calculation from the database library, so as to reduce/correct film stress/strain variations that might be present on the substrate and enhance alignment precision of a subsequent lithographic exposure process.

Figure 6:
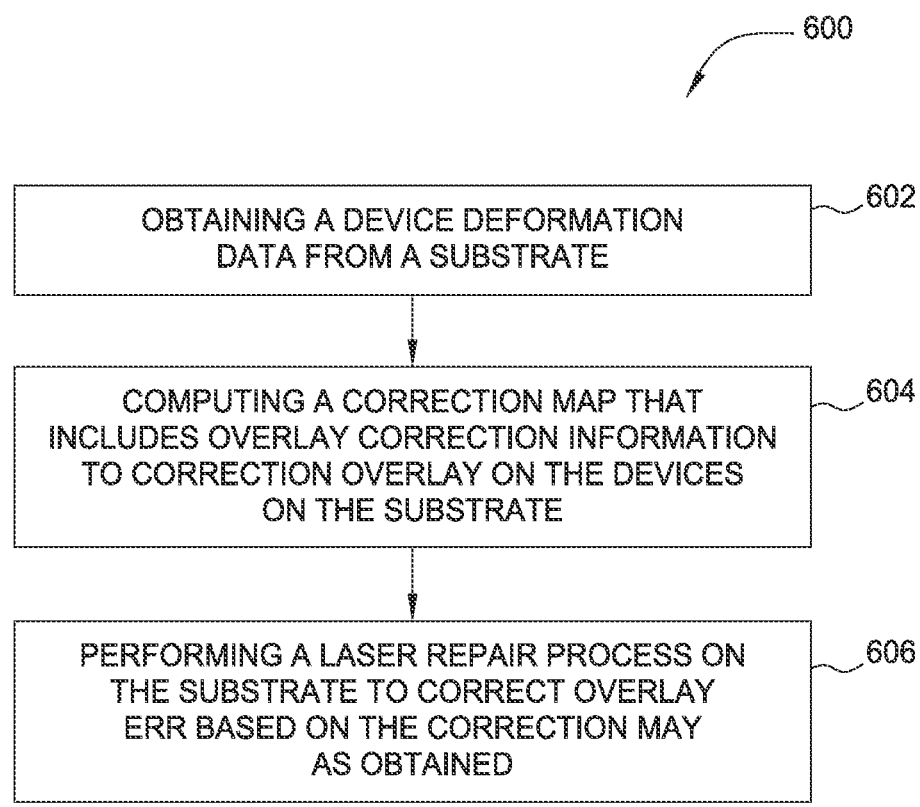
FIG. 6 depicts a flow diagram of a method for performing an overlay correction process on a film layer deposited on a semiconductor substrate utilizing a laser energy treatment process.

FIG. 6 depicts a flow diagram of a process 600 for performing an overlay correction process on one or more film layers disposed on a semiconductor substrate by utilizing a laser energy treatment process.

Figure 2:
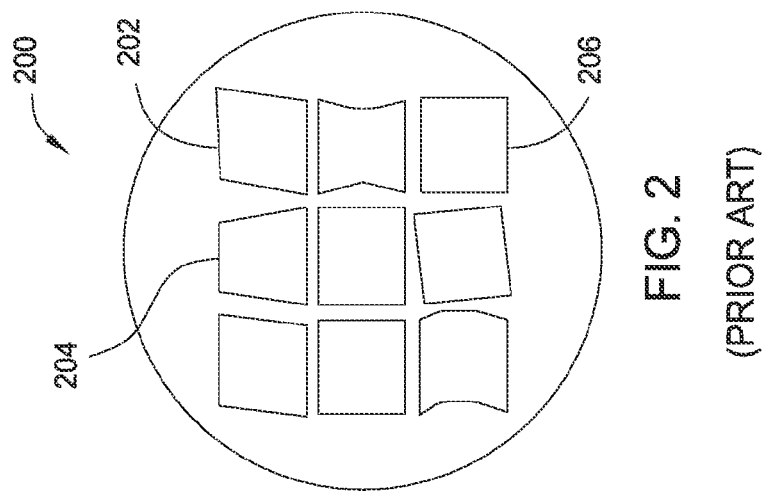
FIG. 2 depicts a schematic view of dies of semiconductor devices having film stress/strain variations.
Figure 1:
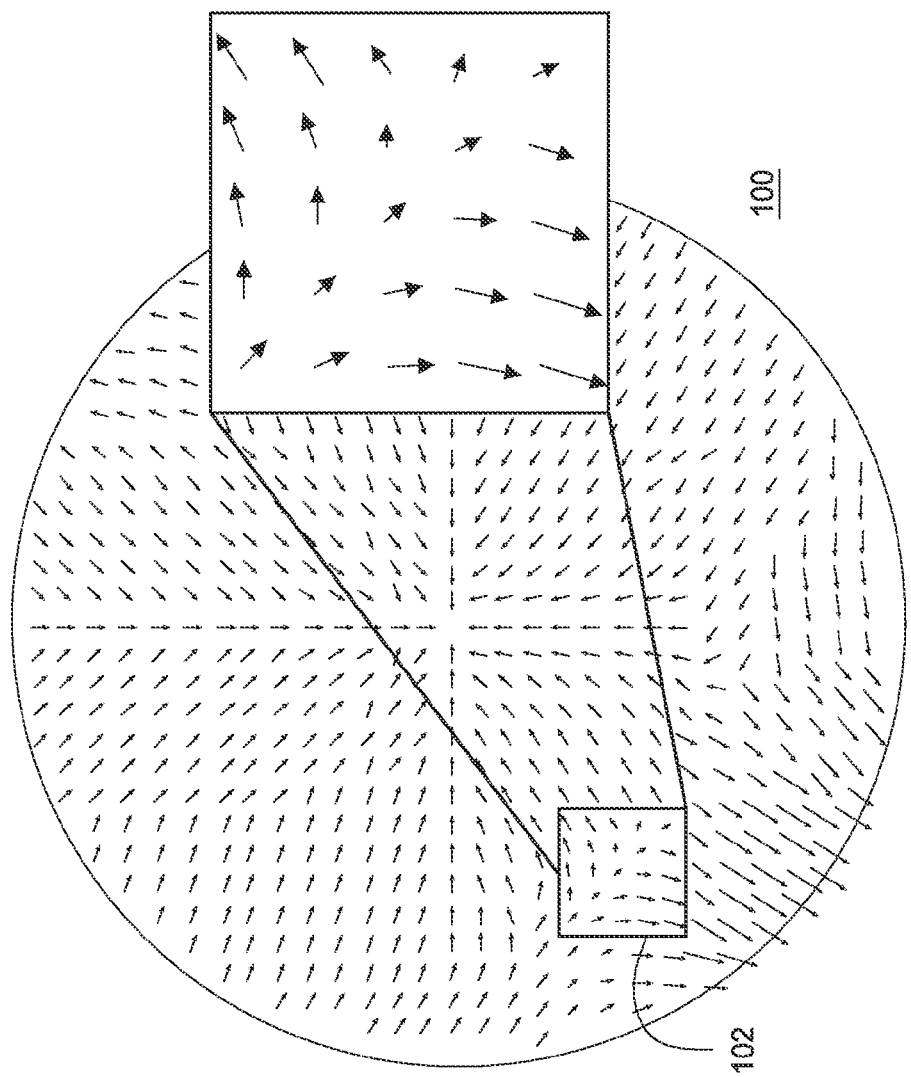
FIG. 1 depicts an overlay error map of a semiconductor substrate measured after a sequence of lithographic processes.

The process 600 starts at block 602 by performing a measurement process on a semiconductor substrate to obtain a device deformation data from the semiconductor substrate. The device deformation data may be obtained by utilizing a metrology tool to scan the semiconductor substrate to determine an overlay error map, such as the overlay error map depicted in FIGS. 1 or 2, or substrate distortion. The metrology tool may be utilized to scan the semiconductor substrate and determine the overlay error map or substrate distortion may be a metrology tool available from KLA-Tencor® of California. Prior to exposure one may measure in-plane distortion using a metrology tool such as the KLA Wafer Sense or the Ultratec Superfast 3G. After lithography one can use a conventional overlay tool to measure actual layer to layer pattern overlay and registration. It is noted that other suitable metrology tools from other manufacturers may also be utilized to perform the scan and measurement process.

In one embodiment, the overlay error map or substrate distortion may be determined by measuring a film stress of the film layer disposed on the semiconductor substrate. The deviation in the film stress distributed across the substrate surface may reflect the degree of film stress/strain variations or pattern displacement/shift present on the substrate.

At block 604, after the data, e.g., the overlay error map or substrate distortion, is obtained from the metrology tool, the data may be received by a data computing system for analysis. The data computing system may be stand-alone processor, such as the data computing system 390 depicted in FIG. 3. The data computing system 390 is in communication with the controller 344 of the laser energy apparatus 300. The data computing system 390 determines a proper laser energy treatment recipe to be performed on the film layer on the substrate in order to reduce film stress/strain variations. In another embodiment, the data computing system may be integrated in the metrology tool performed so as to compare, compute and analyze the data as the substrate measurement process at block 602 is completed. In this embodiment, the data computing system integrated in the metrology tool may also be configured to be in communication with the controller 344 of the laser energy apparatus 300 to assist computing/selecting a proper laser energy treatment recipe.

The data computing system may compare the data obtained from the substrate measurement process at block 602 with the database library or algorithm stored in the data computing system 390 generate instructions that are readable by the controller 344 of the laser energy apparatus 300 to as to determine a proper laser energy treatment recipe to be performed on the substrate. The laser energy treatment recipe may alter, release or eliminate localized residual stress in discrete regions of the film layer, so as to locally change the in-plane strain (or pattern shift, or substrate curvature) in the film layer. By doing so, a deformed projection field (die or dies) may be changed or modified (for example, straightened) and present substantially linear and uniform film properties across the substrate surface. The straightened features allow for reduced film stress/strain variations in the subsequent lithographic exposure process, enhancing alignment precision during the lithographic exposure process.

At block 606, after the laser energy treatment recipe is determined, a laser energy treatment process is then performed using the laser energy treatment recipe. The substrate may be transferred to a laser energy apparatus, such as the laser energy apparatus 300 depicted in FIG. 3, to perform the laser energy process based on the data and error map computed by the data computing system 390 at block 604.

The laser energy treatment process may alter or modify film properties of the film layer disposed on the substrate exposed to the laser energy treatment alter the film stress/in-plane strain (or pattern shift, or substrate curvature) in the film layer so as to change the shape of the die grid and improve alignment precision for the subsequent lithographic exposure process In one embodiment, the laser energy treatment process is performed by applying a series of laser pulses to discrete areas of the film layer according to the specific location requirements identified by the laser energy treatment recipe and determined using the data obtained at block 604. The bursts of laser pulses may have a laser of wavelength greater than 193 nm, for example between about 210 nm and about 810 nm, for example about 405 nm. Each pulse is focused to predetermined regions of the film layer to be treated.

In one embodiment, the spot size of the laser pulse is controlled at between about 100 μm and about 5000 μm. The spot size of the laser pulse may be configured in a manner to alter film property at certain locations of the film layer with desired dimension, feature, pattern and geometries.

The laser pulse may have energy density (e.g., fluence) between about 0.1 milliJoules per square centimeter (mJ/cm$^2$) and about 1000 milliJoules per square centimeter (mJ/cm$^2$) at a frequency between about 1 kHz and about 20 MHz. Each laser pulse length is configured to have a duration of about 10 micro-seconds up to 100 micro-seconds. The laser pulse changes the local stress of the film layer without annealing or otherwise heat treating the entire film layer. A single laser pulse may be used or cumulation of multiple laser doses applied to the same substrate location. After a first substrate location is laser treated, a second substrate location is then laser treated by positioning the laser pulse (or substrate) to direct the pulse to a second location where the second device die is located in the film layer, according to the parameters in the recipe determined at block 604. The laser energy treatment process is continued until the complete substrate dosage map is applied.

Figure 7A:
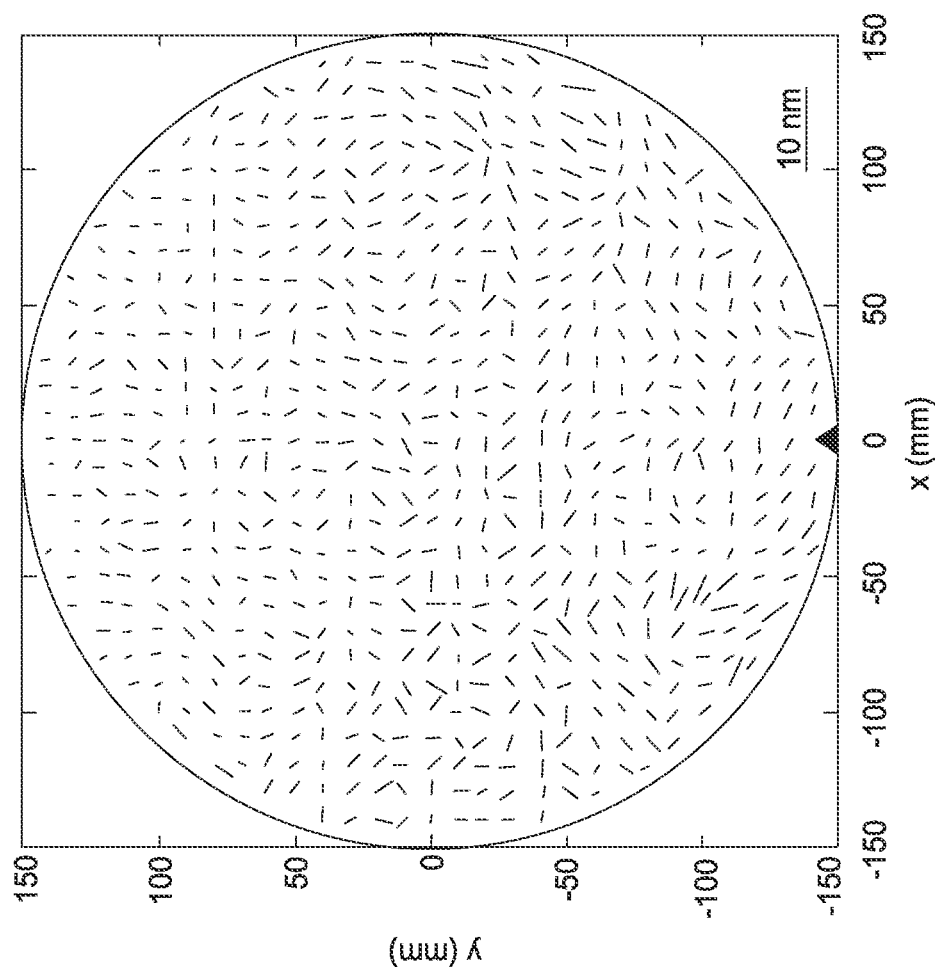
FIGS. 7A-7B depicts an overlay error map after an overlay correction process performed on the substrate.
Figure 7B:
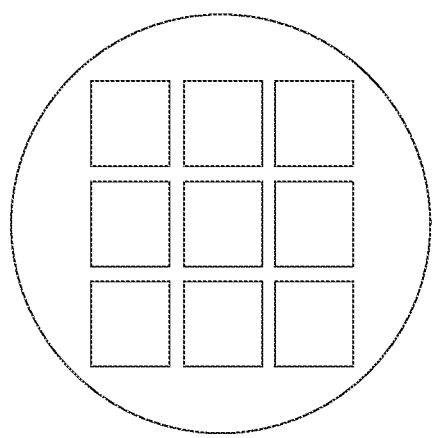

In an exemplary embodiment depicted in FIGS. 7A and 7B, after the semiconductor substrate is laser treated, the features of the device die are significantly displaced, alerted and corrected, as shown in FIG. 7A. The grid pattern of the device die may also be modified and altered to return to a substantially rectangular configuration, as shown in FIG. 7B, so as to enhance alignment precision in the lithographic exposure process with minimum film stress/strain variations.

It is noted that the film layer disposed on the semiconductor layer that may undergo the laser energy treatment process may be fabricated from a dielectric material selected from a group consisting of silicon nitride ($Si_3N_4$), silicon nitride hydride ($Si_xN_y$:H), amorphous carbon, silicon carbide, silicon oxide, silicon oxynitride, a composite film of silicon oxide, silicon nitride, silicon carbide or amorphous carbon, an aluminum oxide layer, a tantalum oxide layer, a titanium oxide layer, spin-cast organic polymers, or other suitable material. In another embodiment, film layer may be any suitable polymer organic material, including SOG, polyimide or any suitable materials.

Thus, embodiments of the disclosure provide a laser energy treatment process that may be utilized to correct film stress/strain variations after a sequence of lithographic exposure processes. The laser energy treatment process as performed may alter film stress/strain distribution in the film layer disposed on the semiconductor substrate. By determining the amount of laser dose required to treatment and alter film stress/strain in the film layers on the semiconductor substrate, the film stress/strain variations may be corrected and eliminated so as to increase alignment precision for the next lithographic exposure process.

While the foregoing is directed to embodiments of the present invention, other and further embodiments of the invention may be devised without departing from the basic scope thereof, and the scope thereof is determined by the claims that follow.

What is claimed is:

1. A method for correcting film stress/strain variations on a substrate comprising:
    performing a measurement process in a metrology tool on a substrate to obtain a substrate distortion or an overlay error map;
    determining dose of laser energy in a computing system to correct film stress/strain variations or substrate distortion based on the overlay error map; and
    providing a laser energy treatment recipe to a laser energy apparatus based on the dose of laser energy determined to correct substrate distortion or film stress/strain variations.

2. The method of claim 1, further comprising:
    performing a laser energy treatment process on the substrate using the determined laser energy treatment recipe.

3. The method of claim 1, wherein computing dose of laser energy further comprises:
    comparing the overlay error map or substrate distortion with database library stored in the computing system.

4. The method of claim 3, wherein the database library includes a correlation of a stress change in a film layer to laser energy dose.

5. The method of claim 4, wherein the film layer disposed on a surface of the substrate is an amorphous carbon hardmask layer or an organic material with or without a thin capping layer.

6. The method of claim 5, wherein the thin capping layer a dielectric layer.

7. The method of claim 2, wherein performing the laser energy treatment process on the substrate further comprises:
    altering a film stress locally or globally in a film layer disposed on the substrate.

8. The method of claim 2, wherein performing the laser energy treatment process on the substrate further comprises:
    correcting film stress/strain variations or substrate distortion found on the substrate.

9. The method of claim 2, further comprising:
    coating a photoresist layer on the substrate and performing a lithographic exposure process after the laser energy treatment process.

10. The method of claim 2, wherein performing the laser energy treatment process on the substrate further comprises
    providing a plurality of laser energy pulses at a wavelength between about 193 nm and about 2 µm.

11. The method of claim 2, wherein computing dose of laser energy for treating the substrate in a computing system further comprises:
    determining discrete locations of the substrate to be treated.

12. The method of claim 1, wherein the laser energy treatment recipe is determined in response to a film stress, substrate curvature, in plane distortion or pattern shift detected on the substrate.

13. The method of claim 1, wherein the substrate distortion measured on the substrate is determined by measuring a film stress of a film layer disposed on the substrate.

14. The method of claim 1, wherein the computing system is incorporated in the metrology tool or in the laser energy apparatus.

15. The method of claim 1, wherein the computing system is in data communication with the metrology tool or the laser energy apparatus.

16. A method for correcting film stress/strain variations on a substrate comprising:
    measuring a film stress hysteresis behavior as a function of laser wavelength or dose for the film layers deposited on a substrate;
    creating a correlation to the film stress hysteresis behavior with a database library to determine a laser energy treatment recipe to be performed in a laser energy apparatus; and
    performing a laser energy treatment process on selected discrete locations of the film layer using the determined laser energy treatment recipe.

17. The method of claim 16, wherein performing the laser energy treatment process further comprises:
    locally altering a residual stress of the film layer to induce an in-plane strain which changes locally to a substrate geometry making up dies or map of dies on the substrate.

18. The method of claim 17, wherein the film stress is altered to correct substrate distortion prior to a lithography process to reduce film stress/strain variations.

19. The method of claim 16, wherein measuring the film stress of the film layer further comprises:
    determining a overlay error map for the substrate.

20. A method for correcting film stress/strain variations on a substrate comprising:
    measuring a film stress, substrate curvature or in-plane distortion or pattern shift of a film layer disposed on a substrate;
    determining an overlay error map or substrate distortion based on the measured film stress on the film layer;
    determining a laser energy treatment recipe based on the measured film stress on the substrate; and laser treating the film layer using the determined laser energy treatment recipe to locally change the film stress of the film layer.

* * * * *